United States Patent
Chatterjee et al.

(10) Patent No.: US 10,184,951 B2
(45) Date of Patent: Jan. 22, 2019

(54) THREE-AXIS MONOLITHIC MEMS ACCELEROMETERS AND METHODS FOR FABRICATING SAME

(71) Applicant: GLOBALFOUNDRIES Singapore Pte. Ltd., Singapore (SG)

(72) Inventors: Aveek Nath Chatterjee, Singapore (SG); Siddharth Chakravarty, Singapore (SG); Ramachandramurthy Pradeep Yelehanka, Singapore (SG); Rakesh Kumar, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 308 days.

(21) Appl. No.: 15/040,681

(22) Filed: Feb. 10, 2016

(65) Prior Publication Data
US 2017/0227570 A1  Aug. 10, 2017

(51) Int. Cl.
*G01P 15/125* (2006.01)
*G01P 15/09* (2006.01)
(Continued)

(52) U.S. Cl.
CPC ........ *G01P 15/125* (2013.01); *G01P 15/0802* (2013.01); *G01P 15/09* (2013.01); *G01P 15/18* (2013.01)

(58) Field of Classification Search
CPC .............. G01P 15/02; G01P 15/0802; G01P 2015/0805; G01P 2015/0828; G01P 2015/0845; G01P 2015/0848; G01P 2015/0862; G01P 15/09; G01P 15/125; G01P 15/18; B81B 3/0064; B81B 2201/0228; B81B 2201/0235; B81B 2203/0118; B81B 2203/0136
(Continued)

(56) References Cited

U.S. PATENT DOCUMENTS

| | | | |
|---|---|---|---|
| 4,951,510 A | * | 8/1990 | Holm-Kennedy ............ G01P 15/0802 73/510 |
| 5,487,305 A | | 1/1996 | Ristic et al. |

(Continued)

OTHER PUBLICATIONS

Acar et al. Environmentally Robust MEMS Vibratory Gyroscopes for Automotive Applications, IEEE Sensors Journal., Dec. 2009, pp. 1895-1906, vol. 9, No. 12.

(Continued)

*Primary Examiner* — Benjamin R Schmitt
(74) *Attorney, Agent, or Firm* — Lorenz & Kopf, LLP

(57) ABSTRACT

Three-axis monolithic microelectromechanical system (MEMS) accelerometers and methods for fabricating integrated capacitive and piezo accelerometers are provided. In an embodiment, a three-axis MEMS accelerometer includes a first sensing structure for sensing acceleration in a first direction. Further, the three-axis MEMS accelerometer includes a second sensing structure for sensing acceleration in a second direction perpendicular to the first direction. Also, the three-axis MEMS accelerometer includes a third sensing structure for sensing acceleration in a third direction perpendicular to the first direction and perpendicular to the second direction. At least one sensing structure is a capacitive structure and at least one sensing structure is a piezo structure.

17 Claims, 6 Drawing Sheets

(51) Int. Cl.
G01P 15/08 (2006.01)
G01P 15/18 (2013.01)

(58) Field of Classification Search
USPC .............. 73/514.01, 514.16, 514.21, 514.32, 73/514.34, 514.36
See application file for complete search history.

(56) References Cited

U.S. PATENT DOCUMENTS

| | | | |
|---|---|---|---|
| 5,668,319 A * | 9/1997 | Garabedian | G01P 15/0802 73/514.06 |
| 6,936,492 B2 | 8/2005 | McNeil et al. | |
| 8,207,004 B2 | 6/2012 | Chen et al. | |
| 2001/0040419 A1 * | 11/2001 | Behin | G02B 6/357 310/309 |
| 2011/0296918 A1 * | 12/2011 | Yao | G01P 15/0802 73/514.34 |
| 2012/0228727 A1 | 9/2012 | Chen et al. | |
| 2014/0150552 A1 * | 6/2014 | Feyh | G01P 15/123 73/504.12 |

OTHER PUBLICATIONS

Amarasinghe et al., Ultra Miniature Novel Three-Axis Micro Accelerometer, IEEE Sensors 2009 Conference, pp. 1305-1308.
Zou et al., Single-and Triaxis Piezoelectric-Bimorph Accelerometers, Journal of Microelectromechanical Systems, Feb. 2008, pp. 45-57, vol. 17, No. 1.

* cited by examiner

THREE-AXIS MONOLITHIC MEMS ACCELEROMETERS AND METHODS FOR FABRICATING SAME

TECHNICAL FIELD

The technical field generally relates to Micro-Electro-Mechanical-Systems (MEMS), and more particularly relates to the integrated use of capacitive accelerometers and piezo accelerometers in MEMS devices and methods for fabricating such devices.

BACKGROUND

Research and development in microelectronics have continued to produce astounding progress in MEMS technology, though MEMS technology continues to rely upon conventional processing. In layman's terms, MEMS are the "eyes" and "arms" that provide the ability to sense and control the environment of a device. MEMS technologies are becoming ever more prevalent in society every day. Use of MEMS technology has limitless applications through modular measurement devices such as accelerometers, gyroscopes, actuators, microphones, and sensors including pressure sensors and inertial sensors.

MEMS devices such as micro-machined accelerometers are highly desirable for inertial navigation and stability control. Various micro-machined accelerometers have been developed based on capacitive, piezoresistive, resonant, tunneling, thermal, or piezoelectric sensing methods.

MEMS based inertial measurement units (IMU) are ubiquitous and are used in domains such as heavy industry, transportation, utilities and energy, and consumer electronics. Market projections anticipate large growth for MEMS based IMU in consumer electronics, such as in cell phones and tablets. Further, there is expected growth for wearable gadgets. To meet projections, the growing trend of IMU technology is reduction in size and reduction in cost. Specifically, wearable gadgets and other consumer goods place a premium on product size and thus, on the MEMS device footprint within the product.

Accordingly, it is desirable to provide an improved three-axis MEMS accelerometer and method for fabricating such a MEMS accelerometer. Further, it is desirable to provide a monolithic MEMS device including both a capacitive accelerometer and a piezo accelerometer. Also, it is desirable to provide a method for fabricating integrated capacitive and piezo accelerometers, such as on a monolithic substrate. Furthermore, other desirable features and characteristics will become apparent from the subsequent detailed description and the appended claims, taken in conjunction with the accompanying drawings and this background.

BRIEF SUMMARY

Three-axis monolithic MEMS accelerometers and methods for fabricating integrated capacitive and piezo accelerometers are provided. In an embodiment, a three-axis MEMS accelerometer includes a first sensing structure for sensing acceleration in a first direction. Further, the three-axis MEMS accelerometer includes a second sensing structure for sensing acceleration in a second direction perpendicular to the first direction. Also, the three-axis MEMS accelerometer includes a third sensing structure for sensing acceleration in a third direction perpendicular to the first direction and perpendicular to the second direction. At least one sensing structure is a capacitive structure and at least one sensing structure is a piezo structure.

In another exemplary embodiment, a monolithic MEMS device is provided. The exemplary monolithic MEMS device includes a capacitive accelerometer formed from a monolithic substrate. Further, the exemplary monolithic MEMS device includes a piezo accelerometer formed from the monolithic substrate.

In yet another exemplary embodiment, a method for fabricating integrated capacitive and piezo accelerometers is provided. The method includes providing a semiconductor substrate including a capacitive device area and a piezo device area. Further, the method includes forming a capacitive accelerometer in the capacitive device area of the semiconductor substrate. Also, the method includes forming a piezo accelerometer in the piezo device area of the semiconductor substrate.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
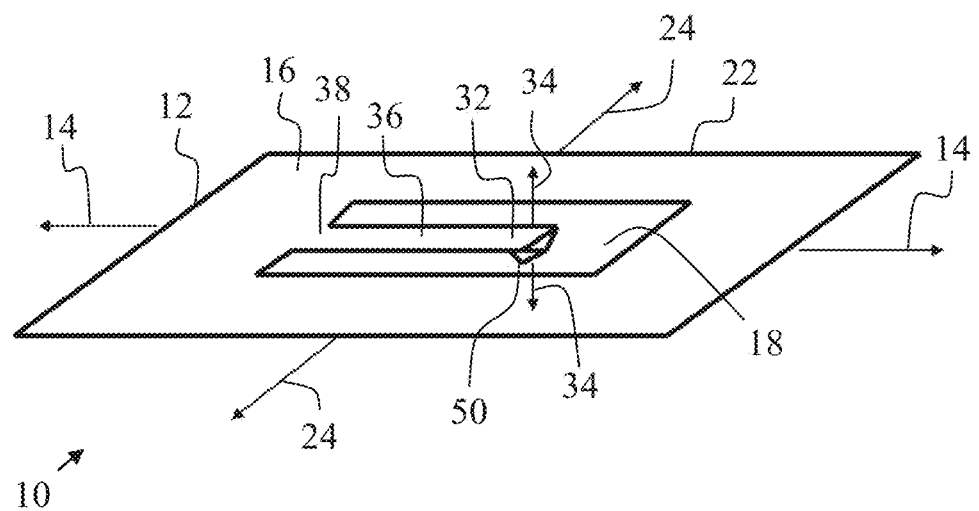
FIG. 1 illustrates, in perspective schematic view, an exemplary three-axis MEMS accelerometer in accordance with an embodiment herein.

The following detailed description is merely exemplary in nature and is not intended to limit the three-axis MEMS accelerometers and methods for fabricating integrated capacitive and piezo accelerometers. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and process steps described herein may be incorporated into a more comprehensive procedure or process having additional steps or functionality not described in detail herein. In particular, various steps in the fabrication of MEMS devices are well-known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As used herein "piezo" materials or devices refers to both piezoelectric and piezoresistive materials or devices. For piezoelectric materials, piezoelectricity forms under pressure, vibration, or other forms of stress. Essentially, a piezoelectric effect is the change in electric charge or potential in response to applied mechanical stress. For piezoresistive materials, resistance forms under pressure, vibration, or other forms of stress. A piezoresistive effect is the change in resistance in response to applied mechanical stress. As used herein, a piezo-effect refers to both a piezoelectric effect and a piezoresistive effect. Further, a piezo accelerometer refers to both a piezoelectric accelerometer and a piezoresistive accelerometer.

As described herein, an exemplary MEMS device is provided with at least one capacitive accelerometer and at least one piezo accelerometer. Specifically, an exemplary MEMS device includes a capacitive accelerometer and piezo accelerometer formed from a single monolithic substrate. Further, an exemplary MEMS device includes a first capacitive accelerometer for sensing acceleration in a first direction, a second capacitive accelerometer for sensing acceleration in a second direction perpendicular to the first direction, and a piezo accelerometer for sensing acceleration in a third direction perpendicular to the first direction and perpendicular to the second direction, with each accelerometer being formed from a single monolithic substrate. Also, an exemplary MEMS device is provided with a capacitive accelerometer having an inertial mass that at least partially surrounds an opening formed within the inertial mass. The exemplary MEMS device further includes a piezo accelerometer positioned within the opening of the inertial mass. Specifically, a cantilever beam of the piezo accelerometer is formed from a same layer as the inertial mass and is separated from the inertial mass by the opening. Due to the integrated use of a capacitive and piezo accelerometer, the footprint of the three axis device is reduced as compared to conventional devices.

As used herein, a "monolithic" MEMS device is realized on a single die and fabricated from a single semiconductor substrate. The semiconductor substrate may be realized from one wafer or from fusion bonded multiple wafers. A CMOS device or devices may be formed on the same substrate as the MEMS device to form a system on a chip (SoC). Alternatively, MEMS devices and CMOS devices may be formed on separate stacks.

Figure 2:
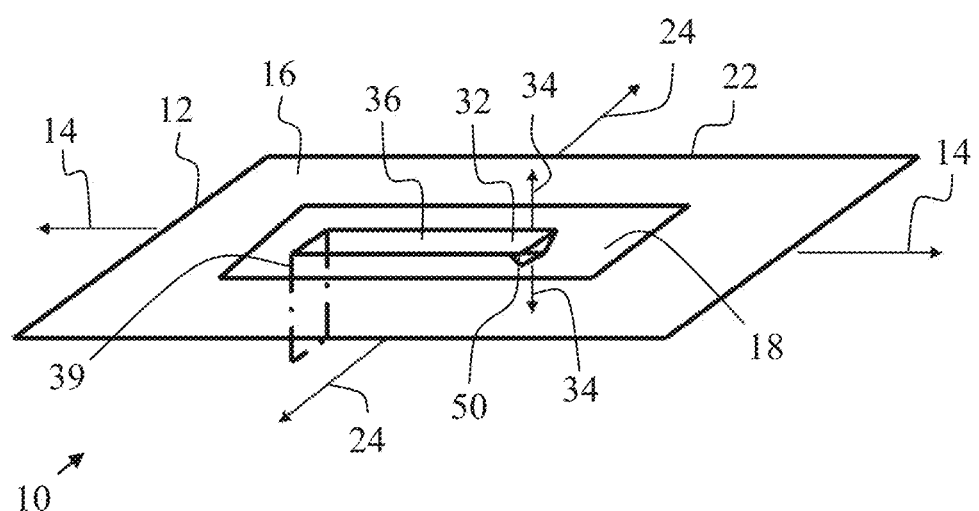
FIG. 2 illustrates, in perspective schematic view, an exemplary three-axis MEMS accelerometer in accordance with another embodiment herein.
Figure 3:
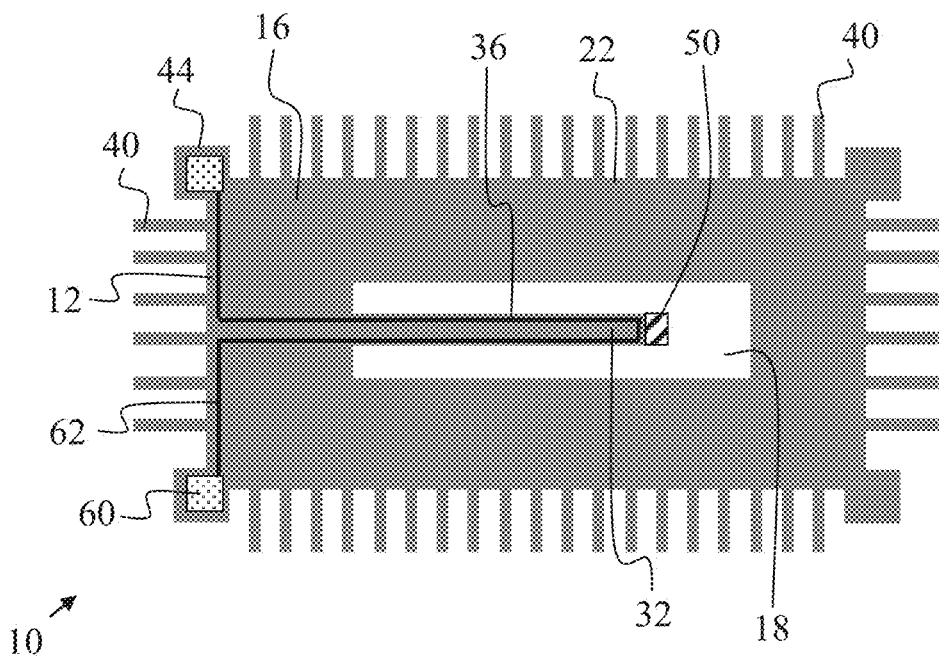
FIG. 3 illustrates an overhead schematic view of the exemplary three-axis MEMS accelerometer of FIG. 1.
Figure 4:
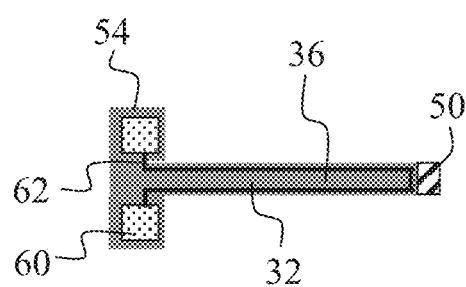
FIG. 4 illustrates an overhead schematic view of the cantilever beam of the piezo electric or piezoresistive accelerometer of the exemplary three-axis MEMS accelerometer of FIG. 2, in accordance with an embodiment herein.

FIGS. 1 and 2 provide perspective schematic views of two embodiments of three-axis MEMS accelerometers 10. FIG. 3 provides an overhead view of the three-axis MEMS accelerometer 10 from the embodiment of FIG. 1. FIG. 4 provides an overhead view of the piezo device area from the embodiment of FIG. 2, provided for measuring acceleration in one direction.

In FIG. 1, an exemplary three-axis MEMS accelerometer 10 includes a capacitive accelerometer 12 for sensing acceleration in the either direction along the X-axis 14. Further, the exemplary three-axis MEMS accelerometer 10 includes a capacitive accelerometer 22 for sensing acceleration in the either direction along the Y-axis 24. Also, the exemplary three-axis MEMS accelerometer 10 includes a piezo accelerometer 32 for sensing acceleration in the either direction along the Z-axis 34. It is noted that the cross sectional views presented in the Figures herein are each presented with the same orientation of axes 14, 24 and 34.

As shown, the capacitive accelerometer 12 and the capacitive accelerometer 22 share an inertial mass or plate 16. The inertial mass 16 is formed with an internal opening 18 that is completely bounded by the inertial mass 16. Alternatively, the internal opening 18 could be partially bounded by the inertial mass 16.

In FIG. 1, the piezo accelerometer 32 includes a cantilever beam 36 that is located within the internal opening 18 of the inertial mass 16 of the capacitive accelerometers 12 and 22. In an exemplary embodiment, the inertial mass 16 and cantilever beam 36 are formed from a common layer (or layers) into which the internal opening 18 is etched to define the inertial mass 16 and cantilever beam 36. In a non-stressed configuration, i.e., a configuration in which inertia is zero, the inertial mass 16 and cantilever beam 36 are co-planar. The cantilever beam 36 is supported by the inertial mass 16. As shown, the piezo accelerometer 32 includes an inertial mass 50 used for piezoelectric or piezoresistive sensing in direction 34.

In the embodiment of FIG. 1, the cantilever beam 36 is coupled to the inertial mass 16. Specifically, the cantilever beam 36 and the inertial mass 16 are connected at location 38. However, it is not necessary that the cantilever beam 36 and the inertial mass 16 be coupled to one another.

For example, in FIG. 2, the opening 18 is formed to completely separate the cantilever beam 36 from the inertial mass 16. As a result, no portion of the cantilever beam 36 is directly connected to the inertial mass 16, and the cantilever beam 36 and inertial mass 16 are decoupled. In such an embodiment, the cantilever beam 36 and inertial mass 16 may be formed from a common layer or layers. Further, in a non-stressed configuration, the inertial mass 16 and cantilever beam 36 are co-planar.

In the embodiment of FIG. 2, the cantilever beam 36 is not supported by the inertial mass 16. Therefore, a frame 39 is provided and contacts and supports the cantilever beam 36 within a cavity to allow for vibration of the cantilever beam 36 along the Z-axis 34. The frame 39 may be formed from the common layer or layers from which the cantilever beam 36 is formed. Inertial mass 50 is used for piezoelectric or piezoresistive sensing in direction 34

FIG. 3 illustrates further details of three-axis MEMS accelerometer 10 of FIG. 1. As shown, the capacitive accelerometer 12 and capacitive accelerometer 22 include sense fingers 40 that extend from the inertial mass 16. The sense fingers 40 of the two capacitive accelerometers 12 and 22 are disposed in a mutually perpendicular arrangement. Further, the inertial mass 16 is supported by a plurality of anchors 44. For example, the inertial mass 16 may be connected to the anchors 44 by compliant springs. For capacitive sensing by accelerometers 12 and 22, the springs will have similar stiffness in the X and Y directions. As is well-known, the fingers 40 coupled to the inertial mass 16 are provided for interaction with fixed fingers (not shown) that are anchored to a stationary substrate. Therefore, when the inertial mass moves in the Y direction, the capacitances between the moving sense fingers 40 of the capacitive accelerometer 12 and the respective fixed fingers change. Similarly, when the inertial mass 16 moves in the X direction, the capacitances between the moving sense fingers 40 of the capacitive accelerometer 22 and the respective fixed fingers change. The device is provided with electronic circuitry which converts these capacitive changes to voltage signals representative of the acceleration along the X and Y axes 14, 24.

The capacitive accelerometers 12 and 22 are manufactured dual axis devices. For sensing acceleration along three mutually orthogonal axes, the piezo accelerometer 32 is provided. In FIGS. 3 and 4, the cantilever beam 36 of the piezo accelerometer 32 is formed with an inertial mass 50. For example, a thin film of metal may be deposited on the cantilever beam 36. An exemplary inertial mass 50 is formed from tungsten. In another embodiment, the inertial mass 50 is formed from SU-8 (an epoxy-based negative photoresist). The inertial mass 50 may be formed with a pointed structure.

Further, bond pads 60 are located on anchors 44. A conductive interconnect 62 connects the bond pads 60 and extends along the cantilever beam 36. For example, a piezoresistive samarium selenium (SmSe) thin film or a piezoelectric aluminum nitride (AlN) thin film or a piezoelectric lead zirconate titanate (PZT) thin film may be selectively formed as shown.

FIG. 4 provides the top view of the piezo device area, which measures acceleration in direction 34. FIG. 4 illustrates the piezo device area of the alternate embodiment of FIG. 2, where the cantilever beam 36 is not coupled to the inertial mass 16 (not shown) of the capacitive sensors 12 and 22 (not shown). In FIG. 4, the cantilever beam 36 may be connected to anchors 54 such as through the frame 39 (not shown) of FIG. 4. Bond pads 60 are located on the anchors 54 and a conductive interconnect 62 connects the bond pads 60 and extends along the cantilever beam 36.

FIGS. 5-9 illustrate an exemplary bulk machining process for forming a three-axis MEMS accelerometer 10. It is noted that FIGS. 5-9 describe a bulk machining process for forming the MEMS device. Alternatively, a surface machining process utilizing a succession of thin film deposition and selective etching may be used. A bulk machining process defines structures by selectively etching inside a substrate. Whereas surface micromachining creates structures on top of a substrate, bulk micromachining produces structures inside a substrate.

Figure 5:
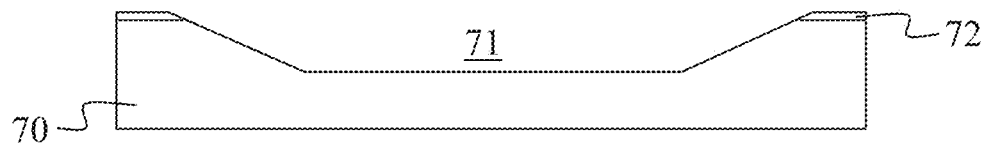
FIGS. 5-9 illustrate cross sectional views of an exemplary process for forming an accelerometer according to an embodiment herein.

In FIG. 5, a semiconductor substrate 70 is provided and processed. It is to be appreciated that various fabrication techniques may be conducted in accordance with the methods described herein to form the semiconductor substrate 70 as shown. Herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor substrate 70 may include a compound semiconductor such as silicon carbide, silicon germanide, gallium arsenide, gallium nitride, indium arsenide, indium gallium arsenide, indium gallium arsenide phosphide, or indium phosphide and combinations thereof. In an exemplary embodiment, the semiconductor material is a silicon substrate. As referred to herein, a material that includes a recited element/compound includes the recited element/compound in an amount of at least 25 weight percent based on the total weight of the material unless otherwise indicated.

An exemplary semiconductor substrate is formed by high resistivity silicon, such as silicon having resistivity greater than 40 Ω-cm. An exemplary semiconductor substrate 70 is a bulk silicon wafer. An exemplary semiconductor substrate has a thickness of from about 250 to about 1000 microns, such as from about 400 to about 600 microns.

As shown in FIG. 5, a thin insulator layer 72 is formed over the substrate 70. An exemplary thin insulator layer 72 is formed from silicon oxide. An exemplary thin insulator layer 72 has a thickness of from about 1 to about 3 μm.

Figure 6:
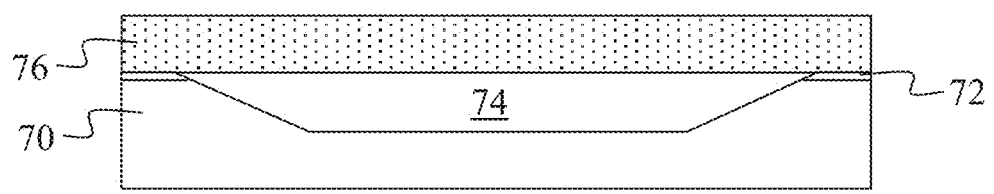

In FIG. 5, the substrate 70 and thin insulator layer are etched to form a cavity 74 in accordance with conventional bulk machining processing. In FIG. 6, a device layer (or layers) 76 is formed over the substrate 70 and encloses cavity 74. For example, device layer 76 may be bonded to the thin insulator layer 72 by fusion bonding. An exemplary device layer 76 is silicon, such as polycrystalline silicon. In an exemplary embodiment, the resistivity of device layer 76 is less than about 15 mΩ-cm. As constructed, the thin insulator layer 72 isolates the substrate 70 from the device layer 76.

Figure 7:
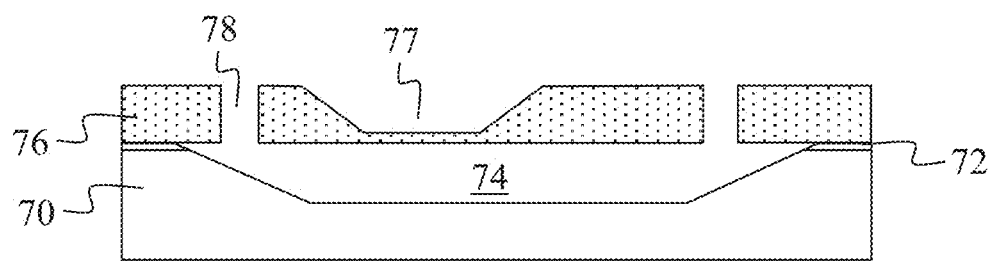

The method may continue in FIG. 7, where the device layer 76 is patterned and etched to form recesses 77 in the device layer 76 and to form openings 78 through the device layer 76 and in communication with the cavity 74. Recesses 77 and openings 78 are selectively formed for the fabrication of the desired capacitive or piezo transducers.

Figure 8:
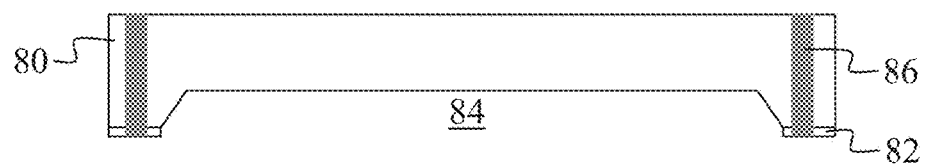

In FIG. 8 a second substrate 80 is provided. Substrate 80 may be formed from a semiconductor material as recited above in relation to substrate 70. An exemplary substrate 80 is formed by high resistivity silicon, such as silicon having resistivity greater than 40 Ω-cm. An exemplary semiconductor substrate 80 is a bulk silicon wafer. An exemplary semiconductor substrate has a thickness of from about 250 to about 1000 microns, such as from about 400 to about 600 microns.

Further, a thin insulator layer 82 is formed on the second substrate 80. An exemplary thin insulator layer 82 is silicon oxide. An exemplary thin insulator layer 82 has a thickness of from about 1 to about 3 μm. As shown in FIG. 8, the substrate 80 and thin insulator layer 82 are etched to form a cavity 84 in accordance with conventional bulk machining processing. Further, vias are etched through the second substrate 80 and thin insulator layer 82 and are filled with a conductor to form conductive through silicon vias (TSVs) 86.

Figure 9:
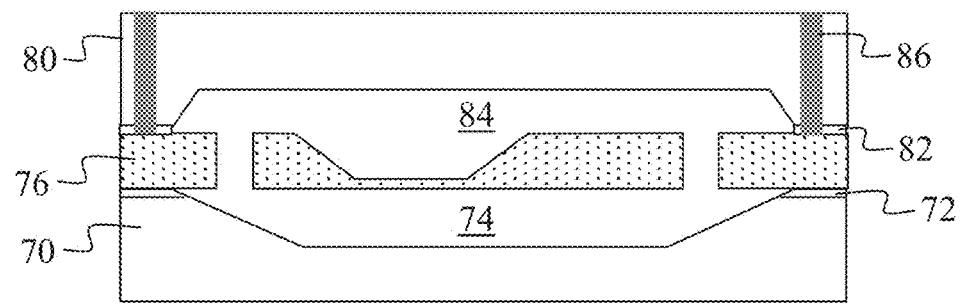

In FIG. 9, the structure of FIG. 8 is bonded to the structure from FIG. 7. Specifically, the thin insulator layer 82 and conductive TSVs 86 of the second substrate 80 are bonded to device layer 76, thereby enclosing the cavity 84. Bonding between the second substrate 80 and the device layer may be via eutectic bonding. As shown, the patterned device layer 76 is enclosed between the cavity 74 and the cavity 84. As shown, the embedded TSVs 86 may carry an electrical signal to or from the device layer 76. The device layer 76 may form a capacitive accelerometer or piezo accelerometer as desired through the formation of contacts, electric interconnects, piezoelectric films or piezoresistive films on or around the device layer 76 and/or cavities 74 and 84.

Figure 10:
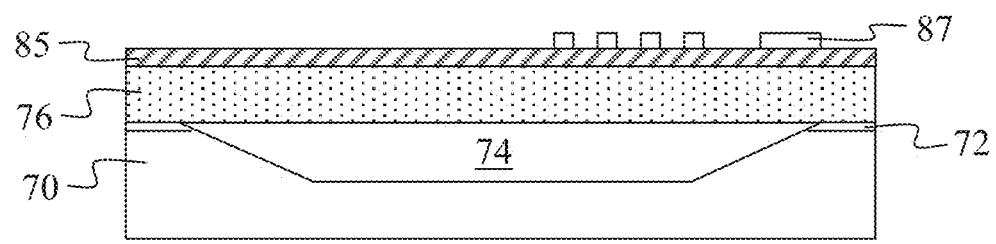
FIGS. 10-12 illustrate cross sectional views of further processing for forming an accelerometer according to an embodiment herein.
Figure 11:
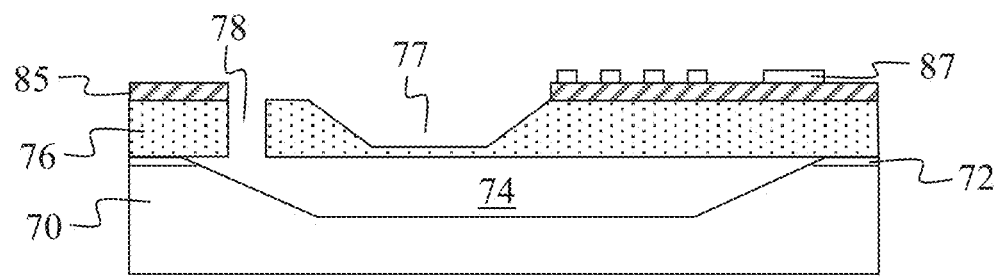
Figure 12:
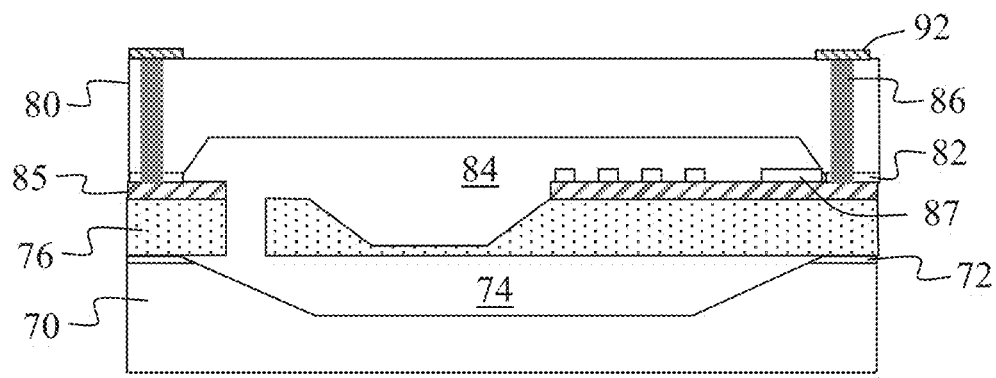

For example, FIGS. 10-12 illustrate processes for forming a piezo accelerometer. The process builds on the structure of FIG. 5. As shown, the device layer 76 is bonded to the thin insulator layer 72 over the substrate 70, as in the process of FIG. 6. In FIG. 10, a thin film stack 85 is formed over the device layer 76. In an exemplary embodiment, the thin film stack 85 is formed from a lower film that is metal, an intermediate film that is a piezo material, and an upper film that is metal. For example, the intermediate film may be formed from aluminum nitride (AlN) or lead zirconate titanate (PZT) or another suitable piezoelectric or piezoresistive material. In an exemplary embodiment, the thin film stack 85 is formed by depositing the film materials by PVD. Electrodes 87, such as input and output electrodes, are formed on the thin film stack 85.

In FIG. 11, the device layer 76 and the thin film stack 85 are patterned, similarly to the process of FIG. 7, to form recesses 77 in the device layer 76 and to form openings 78 through the device layer 76 and in communication with the cavity 74.

Then, in FIG. 12, the second substrate 80 is bonded to the semiconductor substrate 70. Specifically, the thin insulator layer 82 and the conductive TSVs 86 are bonded directly to the device layer 76. As shown, conductive electrodes 92 are formed over the second substrate 80 in electrical contact with the conductive TSVs 86. As a result of the processing of FIGS. 10-12, a piezo accelerometer may be formed. In such a piezo accelerometer, a signal may be transported from the electrodes 87 through a conductive TSV 86 to electrode 92, which may be electrically connected to routing and distribution layers.

Figure 13:
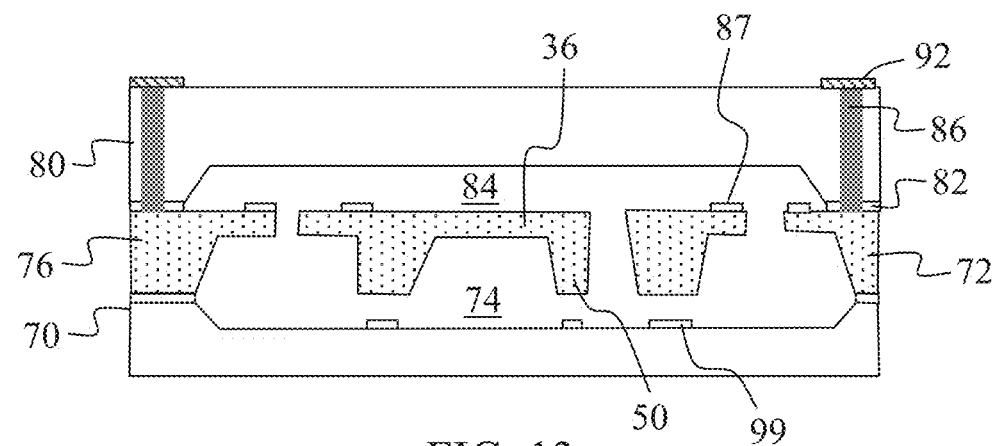
FIG. 13 illustrates a cross sectional view of an exemplary accelerometer according to an alternative embodiment herein.

FIG. 13 illustrates an embodiment of a three-axis accelerometer with capacitive and piezo sensing. Specifically, the accelerometer utilizes piezoresistive sensing in the direction of the Z-axis. In the embodiment of FIG. 13, the film stack is not present; rather, the device layer 72 is doped with piezoresistive material, such as with piezoresistive polycrystalline silicon or with SmSe. Electrodes 87, such as input and output electrodes, are formed on piezoresistive doped device layer 76. Again, signals may be transported from the electrodes 87 through a conductive TSV 86 to electrode 92, which may be electrically connected to routing and distribution layers. As shown, a stopper 99 is formed in the cavity 74 on the substrate 70. Stopper 99 may be provided to prevent contact and adherence between the substrate 70 and the inertial mass 50 of the cantilever beam 36. An exemplary stopper 99 is formed by deposited silicon oxide. While the exemplary stopper 99 is formed as a bumper, the substrate 70 may alternatively be formed with a dimple to minimize or avoid contact with the inertial mass 50. In exemplary embodiments, the inertial mass 50 is formed as a metal deposited thin film formed on the cantilever beam 36.

As described herein, devices are provided with at least one capacitive accelerometer and at least one piezo accelerometer. Further, such accelerometers are formed from a single monolithic substrate. Also, an exemplary MEMS device is provided with a capacitive accelerometer having an inertial mass that at least partially surrounds an opening within which a piezo accelerometer cantilever beam is positioned. Due to the integrated use of a capacitive and piezo accelerometer, the footprint of an exemplary three axis device is reduced as compared to conventional devices.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A monolithic three-axis microelectromechanical system (MEMS) accelerometer comprising:
   a plate formed with an external periphery and an internal opening;
   a first sensing structure for sensing acceleration in a first direction, wherein the first sensing structure is a first capacitive sensing structure and includes fingers extending away from the external periphery of the plate;
   a second sensing structure for sensing acceleration in a second direction perpendicular to the first direction, wherein the second sensing structure is a second capacitive sensing structure and includes fingers extending away from the external periphery of the plate; and
   a third sensing structure for sensing acceleration in a third direction perpendicular to the first direction and perpendicular to the second direction, wherein the third sensing structure is a piezo sensing structure including an inertial mass located within the internal opening of the plate.

2. The three-axis MEMS accelerometer of claim 1 wherein each capacitive sensing structure and the piezo sensing structure are formed from a monolithic substrate.

3. The three-axis MEMS accelerometer of claim 1 wherein:
   the piezo sensing structure includes a cantilever beam located within the internal opening; and
   the plate, the inertial mass and the cantilever beam are formed from the monolithic substrate.

4. The three-axis MEMS accelerometer of claim 1 wherein the plate and the inertial mass are formed from a monolithic substrate.

5. The three-axis MEMS accelerometer of claim 1 wherein the piezo sensing structure includes a cantilever beam coupled to the plate.

6. The three-axis MEMS accelerometer of claim 1 wherein the piezo sensing structure includes a cantilever beam decoupled from the plate.

7. The three-axis MEMS accelerometer of claim 1 wherein the piezo sensing structure includes a cantilever beam decoupled from the plate, and wherein the cantilever beam and the plate are formed from a monolithic substrate.

8. The three-axis MEMS accelerometer of claim 1 wherein the piezo sensing structure includes:
   a cantilever beam; and
   a metal deposited thin film formed on the cantilever beam as the inertial mass.

9. The three-axis MEMS accelerometer of claim 1 further comprising:
   a bottom substrate having an upper surface and a lower cavity formed in the upper surface;
   a device layer bonded to the upper surface of the bottom substrate by fusion, wherein the first sensing structure, the second sensing structure and the third sensing structure are formed in the device layer; and
   a top substrate bonded to the device layer by eutectic bonding, wherein an upper cavity is formed in a lower surface.

10. The three-axis MEMS accelerometer of claim 1 further comprising:
    a bottom polycrystalline silicon substrate having an upper surface and a lower cavity formed in the upper surface;
    a polycrystalline silicon device layer bonded to the upper surface of the polycrystalline silicon bottom substrate, wherein the first sensing structure, the second sensing structure and the third sensing structure are formed in the polycrystalline silicon device layer; and
    a polycrystalline silicon top substrate having a lower surface bonded to the polycrystalline silicon device layer, wherein an upper cavity is formed in the lower surface.

11. A monolithic microelectromechanical system (MEMS) device comprising:
    a capacitive accelerometer including fingers extending from a plate, wherein the fingers and plate are formed from a monolithic substrate and wherein the plate defines an internal opening; and
    a piezo accelerometer including a cantilever beam and an inertial mass in the internal opening of the plate, wherein the cantilever beam is formed from the monolithic substrate; and
    wherein the capacitive accelerometer is a first capacitive accelerometer including fingers extending from the plate in a first direction; and
    wherein the monolithic MEMS device further comprises a second capacitive accelerometer including fingers formed from the monolithic substrate and extending from the plate in a second direction perpendicular to the first direction.

12. The monolithic MEMS device of claim 11 wherein the plate and the cantilever beam are co-planar.

13. The monolithic MEMS device of claim 11 wherein the plate and the fingers are co-planar.

14. The monolithic MEMS device of claim 11 wherein the cantilever beam is decoupled from the plate.

15. The monolithic MEMS device of claim 11 wherein the fingers extend in a first direction and the cantilever beam extends in the first direction.

16. The monolithic MEMS device of claim 11 wherein the piezo accelerometer includes a metal deposited thin film formed on the cantilever beam as the inertial mass.

17. A method for fabricating the monolithic MEMS device of claim 11, the method comprising:
    providing a semiconductor substrate including a capacitive device area and a piezo device area;
    forming the capacitive accelerometer in the capacitive device area of the semiconductor substrate; and
    forming the piezo accelerometer in the piezo device area of the semiconductor substrate.

* * * * *